United States Patent
Brcka

(10) Patent No.: US 7,854,213 B2
(45) Date of Patent: Dec. 21, 2010

(54) MODULATED GAP SEGMENTED ANTENNA FOR INDUCTIVELY-COUPLED PLASMA PROCESSING SYSTEM

(75) Inventor: Jozef Brcka, Loundonville, NY (US)

(73) Assignee: Tokyo Electron Limited, Tokyo (JP)

( * ) Notice: Subject to any disclaimer, the term of this patent is extended or adjusted under 35 U.S.C. 154(b) by 646 days.

(21) Appl. No.: 11/278,324

(22) Filed: Mar. 31, 2006

(65) Prior Publication Data

US 2006/0231030 A1    Oct. 19, 2006

(51) Int. Cl.
C23C 16/00 (2006.01)
C23F 1/00 (2006.01)
H01L 21/306 (2006.01)
H05B 31/26 (2006.01)

(52) U.S. Cl. ............... 118/723 I; 156/345.48; 118/723 IR; 315/11.21; 315/111.51

(58) Field of Classification Search ............... 118/723 I, 118/723 IR; 156/345.48; 315/111.21, 111.51
See application file for complete search history.

(56) References Cited

U.S. PATENT DOCUMENTS

| | | | |
|---|---|---|---|
| 4,957,605 A | 9/1990 | Hurwitt et al. | |
| 6,028,285 A | 2/2000 | Khater et al. | |
| 6,080,287 A | 6/2000 | Drewery et al. | |
| 6,237,526 B1 | 5/2001 | Brcka | |
| 6,268,700 B1 | 7/2001 | Holland et al. | |
| 6,273,022 B1* | 8/2001 | Pu et al. ................... | 118/723 I |
| 6,287,435 B1 | 9/2001 | Drewery et al. | |
| 6,338,313 B1 | 1/2002 | Chan | |
| 6,451,161 B1 | 9/2002 | Jeng et al. | |
| 6,474,258 B2 | 11/2002 | Brcka | |
| 6,495,963 B1 | 12/2002 | Bennett | |
| 6,523,493 B1 | 2/2003 | Brcka | |
| 6,534,493 B1 | 3/2003 | Vazquez et al. | |
| 6,652,711 B2 | 11/2003 | Brcka et al. | |
| 6,685,799 B2* | 2/2004 | Davis et al. ............. | 156/345.48 |
| 2002/0170677 A1 | 11/2002 | Tucker et al. | |
| 2003/0159782 A1 | 8/2003 | Brcka | |
| 2004/0079485 A1* | 4/2004 | Lee et al. ................. | 156/345.48 |
| 2004/0129221 A1 | 7/2004 | Brcka et al. | |
| 2005/0103445 A1 | 5/2005 | Brcka et al. | |

* cited by examiner

FOREIGN PATENT DOCUMENTS

EP    0 838 843 A2    4/1998

*Primary Examiner*—Parviz Hassanzadeh
*Assistant Examiner*—Rakesh Dhingra
(74) *Attorney, Agent, or Firm*—Wood, Herron & Evans, L.L.P.

(57) ABSTRACT

An inductively coupled plasma source is provided with a peripheral ionization source for producing a high-density plasma in a vacuum chamber for semiconductor wafer coating or etching. The source has a segmented configuration with high and low radiation segments and produces a generally ring-shaped array of energy concentrations in the plasma around the periphery of the chamber. Energy is coupled from a segmented low inductance antenna through a dielectric window or array of windows and through a segmented shield or baffle. The antenna for the source is a planer coil having at least two windings with the gap between the windings variable or modulated to control the antenna inductance around the antenna. The antenna has a plurality of, for example three, high inductance segments as a result of the conductor windings being closely spaced alternating with low inductance segments as a result of the conductor windings being widely spaced. The antenna and a shield are part of a plasma source. The shield has a plurality of high transparency segments aligning with the high inductance segments of the antenna. The shield may also have one or more additional high transparency segments along the low inductance portions of the antenna enhance formation of a plasma ring in the chamber.

2 Claims, 8 Drawing Sheets

MODULATED GAP SEGMENTED ANTENNA FOR INDUCTIVELY-COUPLED PLASMA PROCESSING SYSTEM

This application is related to U.S. patent application Ser. No. 10/717,268, filed on Nov. 19, 2003, hereby expressly incorporated herein by reference.

This application is also related to U.S. patent application Ser. No. 11/278,263, filed on Mar. 31, 2006, hereby expressly incorporated by reference herein.

FIELD OF THE INVENTION

This invention relates to high-density plasma generating devices, systems and processes for the manufacture of semiconductor wafers. In particular, the invention relates to antenna structure for producing high-density inductively coupled plasmas (ICP) for such systems and processes.

BACKGROUND OF THE INVENTION

In a variety of integrated circuit (IC) fabrication processes, including plasma etching, plasma enhanced chemical vapor deposition (PECVD), and plasma sputter deposition applications, plasmas are produced within a process chamber by introducing a process gas at vacuum pressure into the chamber and then coupling electrical energy into the chamber to create and sustain a plasma in the process gas. The plasma may exist at various ionization fractions from $10^{-6}$ up to a fully ionized plasma.

Inductively coupled plasmas (ICP) are often used to produce high density plasmas, for example, for processes such as ionized PVD (iPVD) and some types of plasma etching. To generate such plasmas a coil or antenna is shaped and positioned with respect to the processing chamber to inductively couple energy into the processing chamber and thus create and sustain the plasma therein.

In some ICP systems, an inductive coil or antenna is positioned around or proximate the top portion or another end of the chamber to create a plasma within the chamber. Such an antenna is positioned on one side of a dielectric plate or window in the wall of the processing chamber, and electromagnetic energy from the antenna is coupled through the dielectric window and into the plasma. One suitable dielectric material for a window or chamber sidewall is quartz.

The geometry of an ICP system is a factor in determining both plasma density and uniformity, which, in turn, can affect the processing uniformity over the area of the substrate. It has often been regarded as desirable to produce a uniform, high-density plasma over a significantly large area so that large substrate sizes can be accommodated. Ultra large-scale integrated (ULSI) circuits, for example, are presently formed on wafer substrates having diameters of 200 mm and 300 mm.

Numerous coil configurations are used in inductively coupled plasma sources. Generally, these coils are becoming larger, requiring larger dielectric windows to allow RF energy to penetrate into plasma. Scaling up an external antenna for large area plasma in a conventional inductively coupled discharge meets such difficulties as thicker dielectric window to withstand atmospheric forces, and a higher inductance of antenna, significant increase of RF power. Problems also increase in the areas of stray capacitance, mutual coupling, voltage at the ends of scaled antenna, capacitive coupling between the antenna and plasma, sparking and arcing at atmospheric side among others.

The geometry of an inductively coupled plasma source, specifically of the antenna, is known to be a significant factor in determining both the plasma and processing uniformity. In an ICP source, plasma is excited by heating electrons in the plasma region near the vacuum side of the dielectric window by oscillating inductive fields produced by the antenna and coupled through the dielectric window. Inductive currents that heat the plasma electrons are derived from RF magnetic fields produced by RF currents in the antenna. The spatial distribution of the magnetic field is a function of the sum of the fields produced by each portion of the antenna conductor. Therefore the geometry of the inductive antenna and efficiency of RF power delivery into the plasma can in large part determine the spatial distribution of the plasma ion density within the reactor chamber.

In some cases, a Faraday shield that is transparent to the inductive component of the electromagnetic field is used to suppress the capacitive coupling from the antenna to the plasma and to prevent a conductive or other contaminating layer from building up on the dielectric window. The geometry and structure of such a shield have an effect on the spatial distribution of plasma inside the chamber as well.

SUMMARY OF THE INVENTION

An objective of the present invention is to improve the plasma processing uniformity on semiconductor wafers, particularly in applications involving etching or higher pressure coating processes.

A particular objective of the present invention is to provide a plasma source for utilization in the plasma processing of large area substrates, including by processes of plasma etching, plasma deposition and plasma cleaning. A more particular objective of the invention is to provide a low inductance inductive device for such a source.

Other objectives are to provide a plasma source for processing larger area substrates with uniform plasma processing, to provide a low inductance inductive device for such a source, and to provide a highly effective plasma source that is simplified and reduces overall chamber cost.

In accordance with the principles of the present invention, an active peripheral ionization source is provided for use in producing a plasma density that yields uniform plasma processing for semiconductor wafers. Such a source is particularly useful for large wafers such as 300 mm wafers. Further in accordance with the present invention, an ICP source is provided with a low inductance inductive radiating device in the form of an antenna or coil for coupling energy into the vacuum plasma processing chamber.

In various embodiments of the invention, an ICP source is provided with a segmented antenna having locally differing parameters and providing a generally lowered impedance. The antenna is configured to produce enhanced peripheral ionization. Typically, such ionization produces a generally ring-shaped plasma which compensates for the overall chamber and source geometry so as to produce a uniform effective plasma at the surface of the wafer for processing the wafer. The ring-shaped plasma is, in many embodiments, in the form of an annular array of alternating high and low power concentration regions around the periphery of the chamber.

An illustrated embodiment of the invention provides an antenna design for inductively coupled high density plasma sources in which plasma is generated and maintained by inductive elements shaped distribute RF power into the plasma. The inductive elements allow the source to operate in an RF range of electromagnetic energy that is typical for creating plasma in the processing space from process gas introduced therein for processing semiconductors. According to certain embodiments, high and low inductance portions are combined into one inductive system with the inductance of the individual portions controlled by cross-sections and lengths of individual elements.

In an illustrated embodiment of the invention, a multiple turn planer coil antenna is provided using a single conductor of uniform cross-section. The high inductance portions of the antenna are produced by providing a narrow gap between different coil turns in the high efficiency segments of the source. Low inductance portions of the antenna are produced by providing a wide gap between the different coil turns. The antenna is combined with a shield to form a plasma source. The shield has high transparency segments adjacent the high inductance segments of the antenna to allow for the coupling of energy in concentrated segments corresponding to the number of high inductance segments of the antenna. The shield may also have one or more additional high transparency segments adjacent each low inductance antenna segment to allow coupling of additional energy between the high efficiency sections.

These and other objectives and advantages of the present invention will be more readily apparent from the following detailed description.

DETAILED DESCRIPTION

Figure 1:
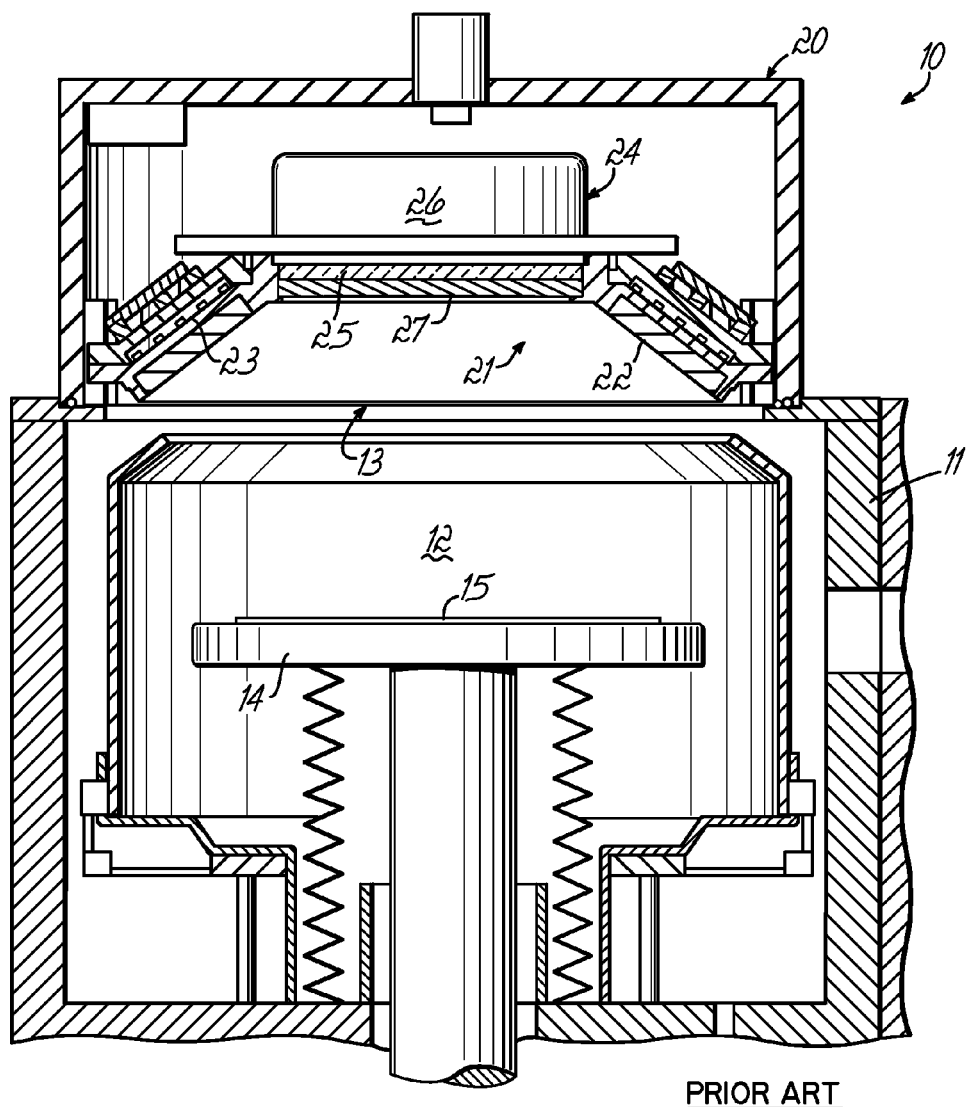
FIG. 1 is a simplified diagram of a prior art ionized physical vapor deposition apparatus of one type to which certain embodiments of the present invention can be applied.
Figure 1A:
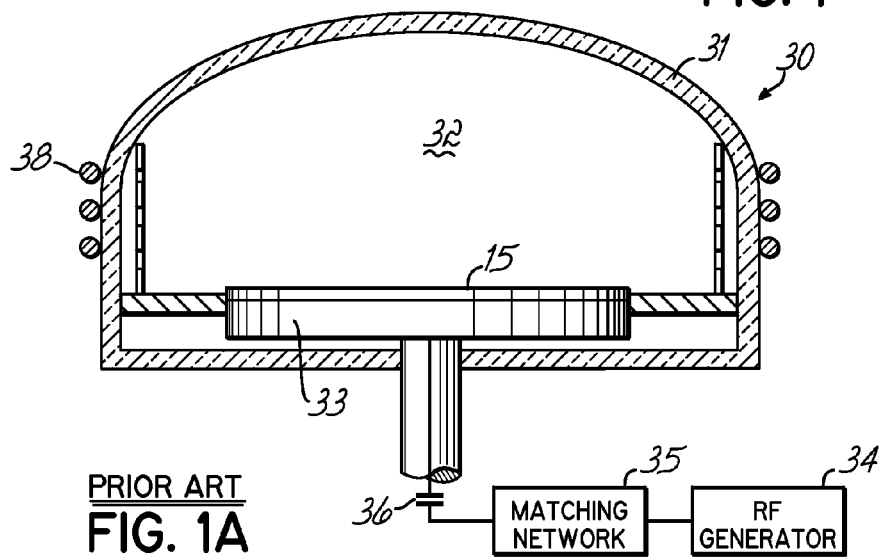

The ICP source of the present invention can be used in various plasma processing systems, such as those for performing sputter etching and deposition processes, plasma-enhanced CVD (PECVD) processes, ionized PVD (iPVD) processes, and reactive ion etching processes (RIE). FIG. 1 illustrates an iPVD apparatus 10 of a type for the manufacture of semiconductor wafers in which embodiments of the invention are described below. Examples of semiconductor wafer processing machines of the iPVD type are described in U.S. Pat. Nos. 6,080,287 and 6,287,435, both hereby expressly incorporated by reference herein.

The iPVD apparatus 10 includes a vacuum processing chamber 12 enclosed in a chamber wall 1 having an opening 13 at the top thereof in which is mounted an ionized sputtering material source 20, which seals the opening 13 to isolate the vacuum within the chamber 12 from external ambient atmosphere. Within the chamber 12 is a wafer support 14 that holds a semiconductor wafer 15 with a side thereof to be processed facing the opening 13. The ionized material source 20 includes a magnetron cathode assembly 21 that includes an annular target 22, which is the source of the coating material, typically but not necessarily a metal. The cathode assembly also includes a power supply (not shown) for applying a negative DC sputtering potential to the target 22 and a permanent magnet assembly 23 situated behind the target 22, which traps electrons energized by the DC potential over the surface of the target 22 to form a primary plasma that produces ions in the gas within the chamber to sputter material from the target 22.

In the source 20, the target 22 is annular and surrounds a dielectric window 25, typically formed of quartz or alumina, that is sealed to the target 22 at its center. The target 22 and the window 25 form part of a vacuum enclosure for the chamber 12 along with the chamber wall 11. An RF ICP source 24 is situated at the window 25 and couples RF energy into the chamber 12 to energize a secondary high-density inductively coupled plasma within the chamber 12. The RF ICP source 24 includes an antenna or coil 26 situated on the atmospheric side of the window 25 and a deposition baffle or shield 27 that covers the window 25 on the inside of the chamber 12. An RF generator (not shown) is connected across the leads of the antenna 26 through a suitable matching network. Typically, the RF generator operates at the industrial frequency of 13.56 MHz. Pressures in the chamber 12 for iPVD usually fall in the range from 10 mTorr to 150 mTorr.

The antenna 26 and the shield 27 are designed together to most effectively inductively couple RF energy from the antenna 26 into the chamber 12 through the window 25 and shield 27, with low capacitive coupling from the antenna 26 into the chamber 12 that would impose a voltage on the plasma. The shield 27 is further configured to protect the window 25 from accumulated deposition, which, where the coating material is metal in particular, renders the window 25 opaque to radiation from the antenna, and interferes with the coupling of energy into the plasma. Details of antennas and the accompanying shields are described in U.S. Pat. Nos. 6,237,526 and 6,474,258, and U.S. patent application Ser. Nos. 10/080,496 and 10/338,771, all hereby expressly incorporated by reference herein.

Figure 2:
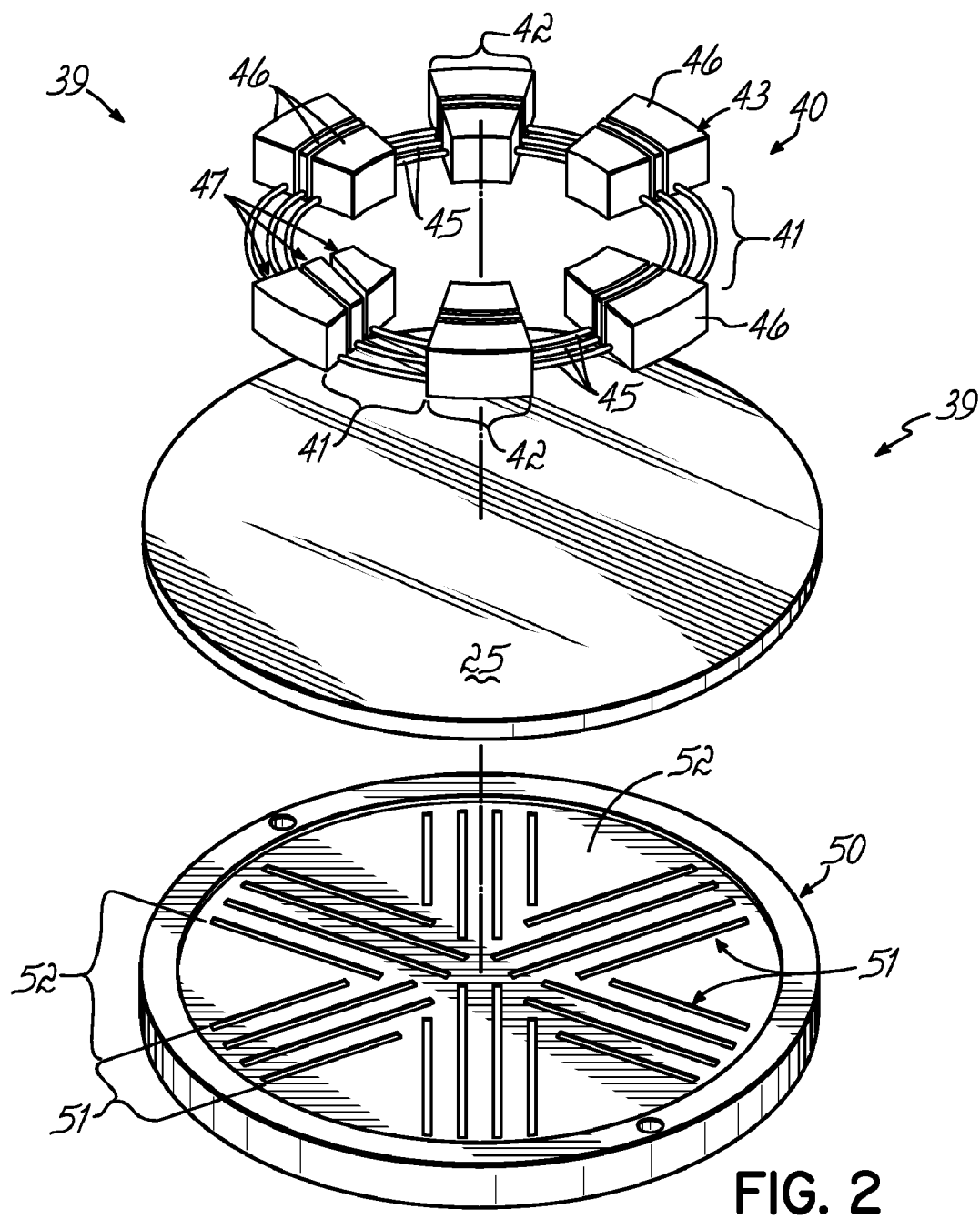
FIG. 2 is an expanded perspective view of a segmented peripheral ionization ICP source.

FIG. 2 illustrates one embodiment of a peripheral ionization source 39 that is more particularly described in the related U.S. patent application Ser. No. 10/717,268. The peripheral ionization source 39 includes a segmented antenna 40 and preferably also a deposition baffle or shield 50, which may be installed in an ICP processing machine, aligned with each other on opposite sides of a dielectric section of, or window 25 in, the vacuum chamber wall of the apparatus. The antenna 40 is located in an atmospheric pressure environment outside of the window 25 while the baffle 50 is located in the vacuum chamber inside of the window 25. The antenna 40 is formed of one or more windings of a conductor 43 having high-efficiency, relatively high-inductance sections 41 alternating with low-efficiency, relatively low-inductance sections 42. The baffle 50, when employed, is formed of relatively transparent areas 51 alternating with relatively opaque areas 52. Installed in the processing apparatus, the high-efficiency sections 41 of the antenna 40 align with the high-transparency sections 51 of the baffle 50 while the low-efficiency sections 42 of the antenna 40 align with the low-transparency sections 52 of the baffle 50. Such sources and alternatives thereto are described in related U.S. patent application Ser. No. 10/717,268 referred to above.

Figure 3:
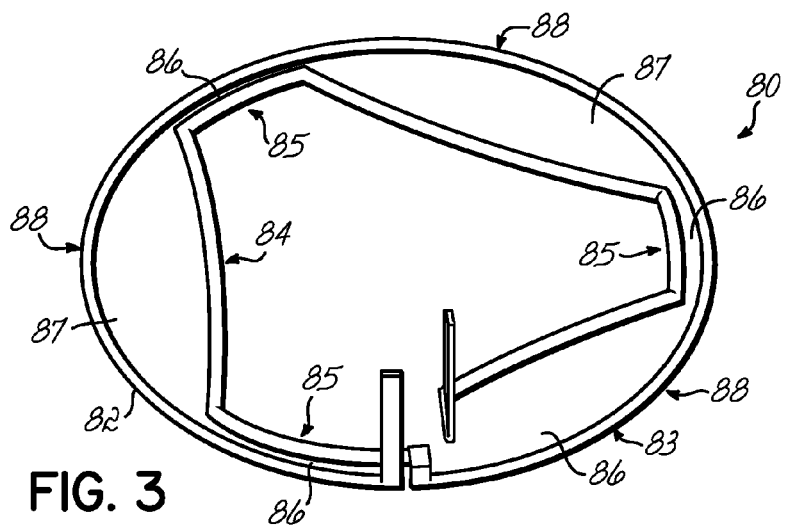
FIG. 3 is a perspective diagram of an antenna for the ICP source of FIG. 2 according to an embodiment of the present invention.

FIG. 3 illustrates a segmented planer antenna 80 formed of a single continuous conductor 81 of uniform circular or tubular cross-section. The conductor 82 is formed into a plurality of windings, including an outer winding 83 and an inner winding 84, lying in a common plane. The outer winding 83 is circular. The inner winding has a shape modulated so that the magnetic field around the windings 83, 84 interact to form a segmented antenna 80 having a plurality of alternating high and low inductance or radiation segments 85. These high inductance segments 85 are formed by the existence of a narrow gap 86 between the windings 83,84 in the segments 85, which result in most of the magnetic fields around the conductor in both windings 83,84 at the segments 85 to encircle both windings so that they reinforce each other and produce a strong resultant field in the chamber to form regions where energy coupled into the plasma from the antenna is relatively high.

Between each of the high induction segments 85 the conductor 82 of the inner winding 84 is modulated in shape to form a widened gap 87 between the windings 83,84. As a result, the magnetic fields from the two windings 83,84 in cancel each other in the widened gap 87, thereby forming a low inductance or low radiation segments 88 of the antenna 80 in the sections having the widened gap 87. The antenna 80, due to its configuration, will tend to produce a ring-shaped array of plasma concentrations in a processing chamber. With the antenna 80 as illustrated, which has three equally spaced high inductance sections 85 alternating with three low inductance sections 88, a plasma having three areas of high energy density interconnected with three areas of lower energy density would be formed.

Such an antenna 80 can be combined with a shield having three high and three low transparency segments, or with a shield of another configuration, such as, for example, shield 50 described above, as shown in FIG. 4. Shield 50 presents three high transparency segments 52a, one aligned with each of the high inductance segments 85 of the antenna 80, as well as three other high transparency segments 52b, as illustrated, which are centered on the low inductance segments 88 of the antenna 80. As such, alternating high and lower concentrations of energy, 71 and 72 respectively, are coupled into the plasma with intervening segments at which substantially no energy is coupled through the shield 50 at areas 74 between them, as represented by the energy density diagram 70, as illustrated in the diagram of FIG. 5.

Figure 6:
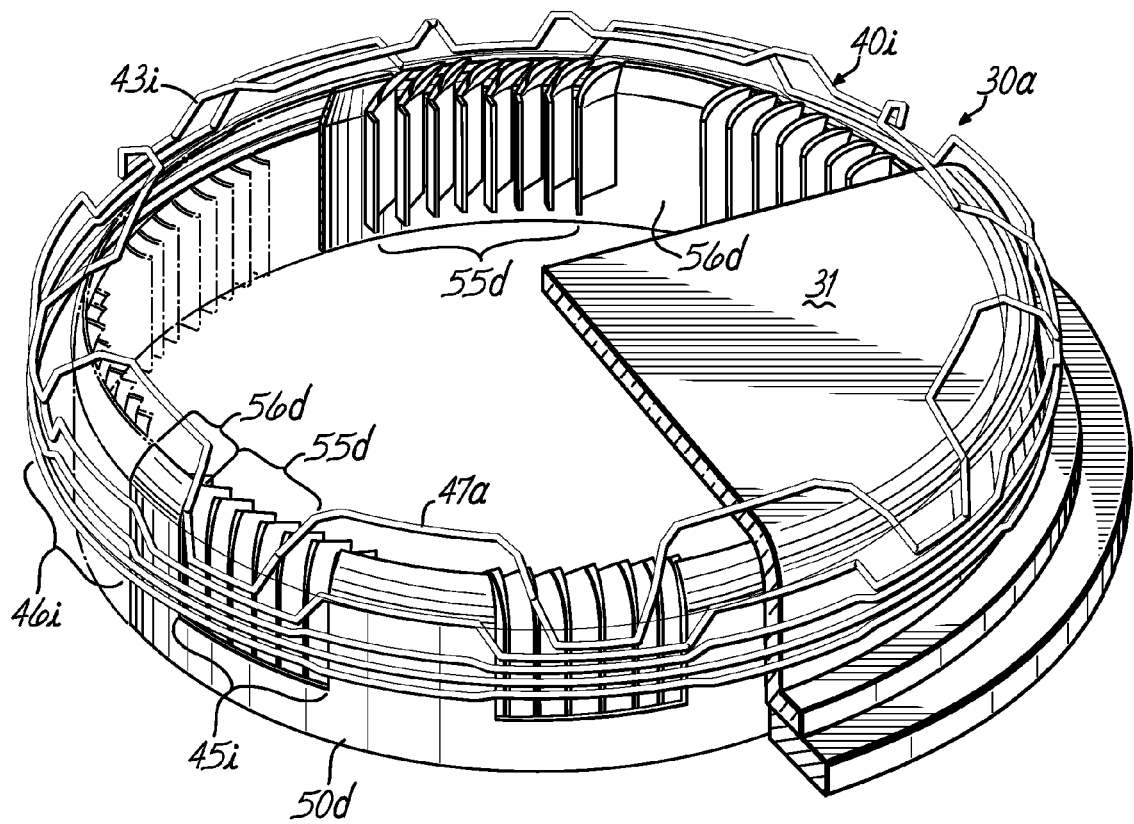
FIG. 6 is a diagrammatic perspective view of an ICP source for an etch apparatus having an antenna according to alternative embodiments of the present invention.

FIG. 6 illustrates a cut-away portion of an etch module 30a similar having another particularly cost-effective peripheral inductive element that can be manufactured using simple ICP source construction techniques. In FIG. 6, the dielectric wall 31 of the etch module 30a is surrounded by a modified helical antenna 40i that utilizes multiple windings of a conductor 43i formed of small size tubing throughout its length. The conductor 43i is configured to provide the advantages of the varying cross-section segmented antenna conductors 43 described above. A deposition shield 50d is provided on the inside of the bell jar-shaped dielectric wall 31. The shield 50d has high and low-transparency sections 55d,56d that respectively correspond to and radially align with high-efficiency sections 45i of the antenna 40i, in which the windings lie close together, and low-efficiency sections 46i of the antenna 40i, in which the windings are spread apart. The alternating closely-shaped or bundled conductors and spaced-apart or diverging conductor sections, 45i and 46i, respectively, of antenna 40i, have high and low-inductance and radiation efficiency, because the spreading of the conductors results in magnetic fields that oppose each other close to and between the individual conductor windings in the diverging sections 46i, while the closeness of the conductors results in magnetic fields that enforce each other by encircling the entire bundled conductor sections 45i.

In FIG. 6, the inductive element 43i is created by the tubular conductor 43i that is azimuthally divided into multiple sections, for example, eight sections, with the high and low-efficiency sections 45i, 46i each spanning 22.5 degrees. The pitch between individual loops is small in the high-efficiency, bundled-conductor sections 45i to generate locally stronger RF magnetic fields in the plasma. The pitch between individual loops is large in the low-efficiency, diverging-conductor sections 46i to generate reduced RF magnetic fields when passing through the dielectric wall.

The baffle 50d in the embodiment of FIG. 6 is generally cylindrical and surrounds the inside sidewall of the bell jar-shaped dielectric 31 directly opposite the antenna 40i, and generally protects the window from deposits around its cylindrical peripheral sidewall. The top portion of the dielectric 31 is not protected by the baffle 50d, but because the antenna does not rely on coupling through this portion, deposits on this portion do not interfere with the efficiency of the plasma generation. The high-transparency sections 55d, which align with the high-efficiency sections 45i of the antenna 40i, block all but minimal deposition on the dielectric 31, where the opaque sections 56d almost totally prevent deposits on the adjacent sections of the dielectric. Nonetheless, deposits of metal on the dielectric 31 adjacent the high-transparency sections 55d eventually begin to reduce RF coupling through the dielectric 50d at these portions. When this condition is reached, the antenna 40i can be rotated by 22.5 degrees to move the areas of accumulated deposits on the window 31 to double the mean-time-before-cleaning (MTBC) of the window.

The antenna 50d also has one of the windings, namely winding 47a, in the divergent sections 46i of the antenna 40i, extending partially around to the top side of the dielectric window 31, beyond the extent of the baffle 50d. Such extended windings 47a have a small capacitive coupling with the plasma and, as a result, are effective in coupling energy to the plasma during plasma ignition.

Figure 6A:
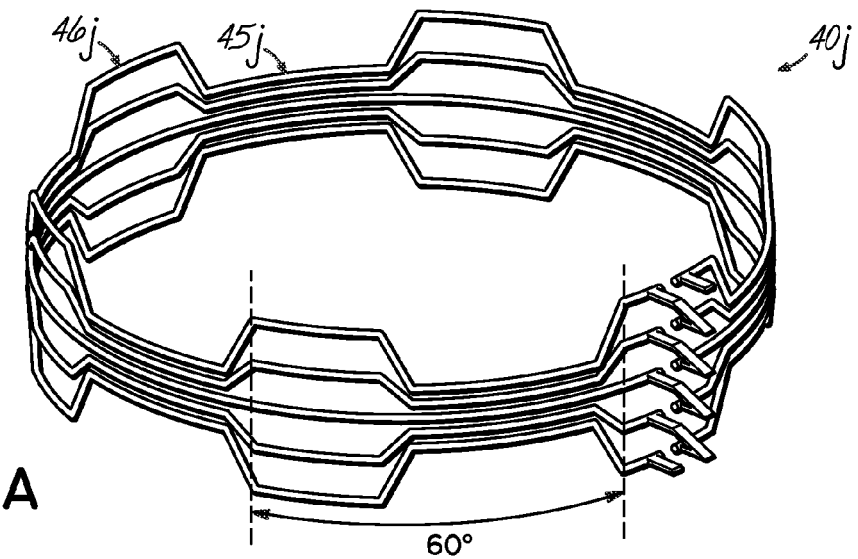
FIG. 6A is an alternative antenna for the source of FIG. 6.
Figure 6D:
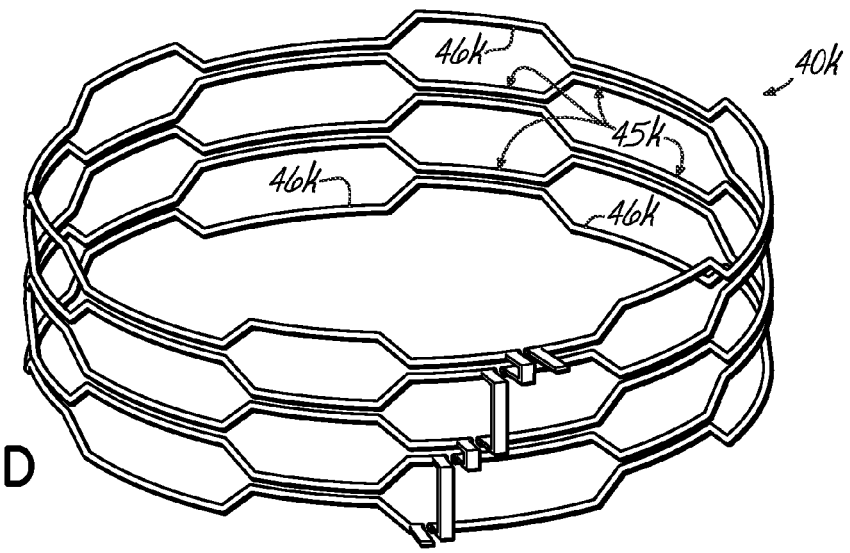
FIG. 6D is an alternative antenna for the source of FIG. 6.
Figure 6G:
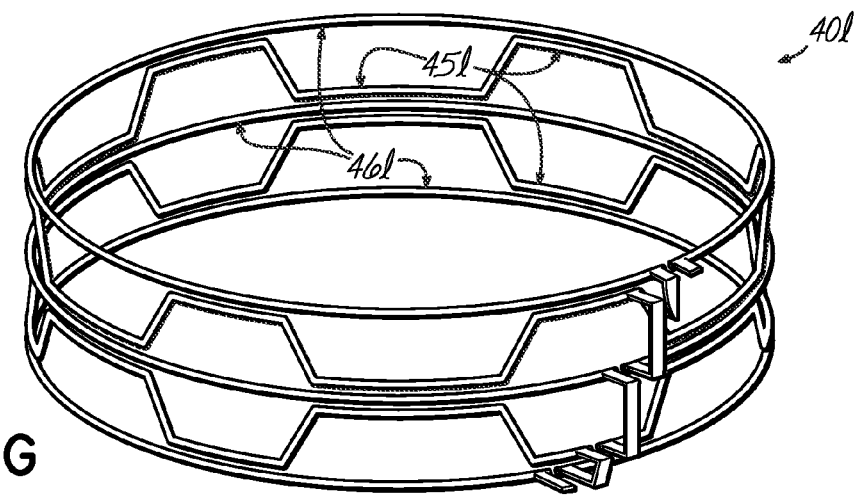
FIG. 6G is an alternative antenna for the source of FIG. 6.
Figure 6B:
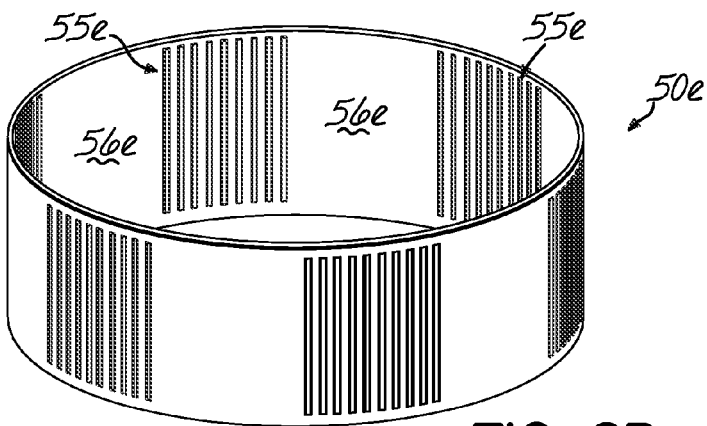
FIG. 6B is a deposition baffle for a source having the antenna of FIG. 6A.

FIGS. 6A, 6D and 6G illustrate antennas 40j, 40k, and 40l, respectively, that are variations of the antenna 40i of FIG. 6, where the windings are configured in six alternating sections spanning 30 degrees each. The antenna 40j may be used, in place of the antennas 40f, 40g and 40h, with the shield 50e of FIG. 6B, producing the energy distribution 60c of FIG. 6C. Peak power density is approximately up to 0.48 Watts/cm$^2$ in regions 61c of FIG. 6F at 10 amp current through inductive element 40j, with little deposited power in regions 62c. Total deposited power into plasma is about 316 watts at these conditions.

Figure 6E:
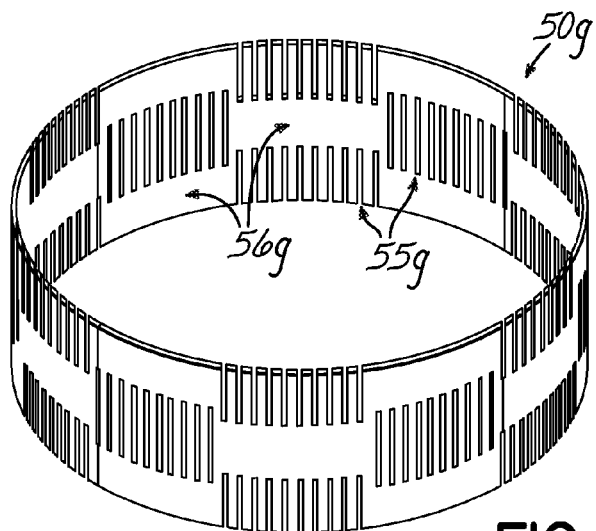
FIG. 6E is a deposition baffle for the antenna of FIG. 6D.
Figure 6H:
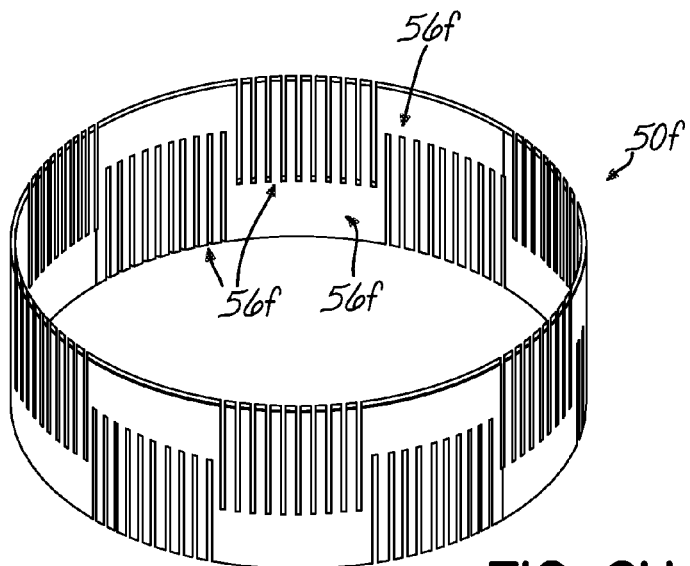
FIG. 6H is a deposition baffle for the antenna of FIG. 6G.
Figure 6C:
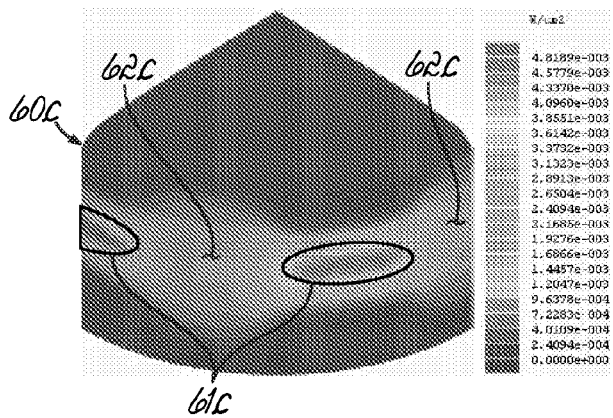
FIG. 6C is a power distribution diagram for an ICP source having the antenna of FIG. 6A and baffle of FIG. 6B.
Figure 6F:
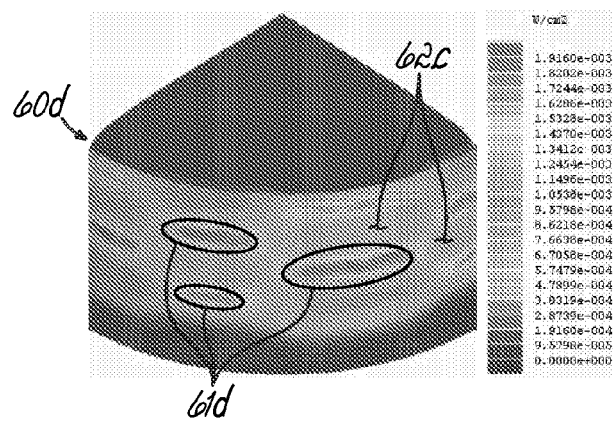
FIG. 6F is a power distribution diagram for an ICP source having the antenna of FIG. 6D and baffle of FIG. 6E.

Antennas 40k and 40l are configured in a honeycomb structure and may be used with the appropriate shields, including shields 50f and 50g, respectively, of FIGS. 6E and 6H, producing the energy distributions 60d and 60e of FIGS. 6F and 6G. The shield 50e has a single row of full-height alternating high-transparency and opaque sections 55e and 56e, respectively, to align with the high and low-efficiency sections 45j and 46j of the antenna 40j. Shield 50f has two staggered rows of alternating high-transparency and opaque sections 55f and 56f, respectively, to align with the high and low-efficiency sections 45k and 46k of the antenna 40k, while shield 50g has three staggered rows of alternating transparency and opaque sections 55g and 56g, respectively, to align with the high and low-efficiency sections 45l and 46l of the antenna 40l.

Figure 6J:
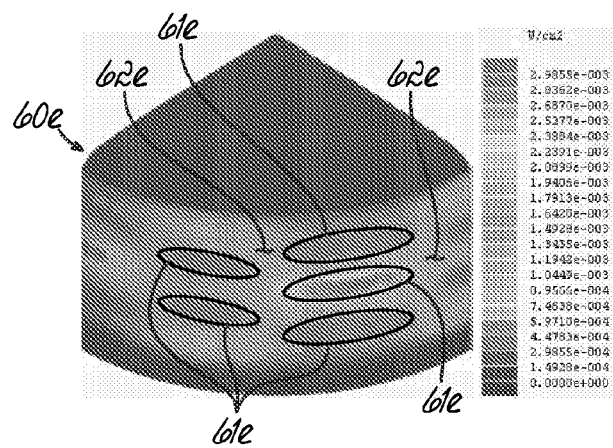
FIG. 6J is a power distribution diagram for an ICP source having the antenna of FIG. 6G and baffle of FIG. 6H.

For the honeycomb structure of the conductors within the antennas 40k, peak power density is approximately 0.19 W cm$^{-2}$ in the regions 61d of FIG. 6F with little power deposited in the regions 62d. Total deposited power into plasma is approximately 220 watts. Inductance of the antenna 40k is less than for antenna 40j, e.g. 8.34 mH for antenna 40l versus 10.73 mH for antenna 40j. For antenna 40l, peak power density is 0.30 Wcm$^{-2}$ in regions 61e of FIG. 6J with little deposited power in regions 62e. Total power is 235 watts at 10 amps, 450 kHz, with inductance at 8.59 mH.

The deposition shields 50e, 50f and 50g of FIGS. 6B, 6E and 6H have the high-transparency portions 55e, 55f and 55g adjacent the areas of reduced pitch of the respective antennas 40j, 40k and 40l.

Figure 4:
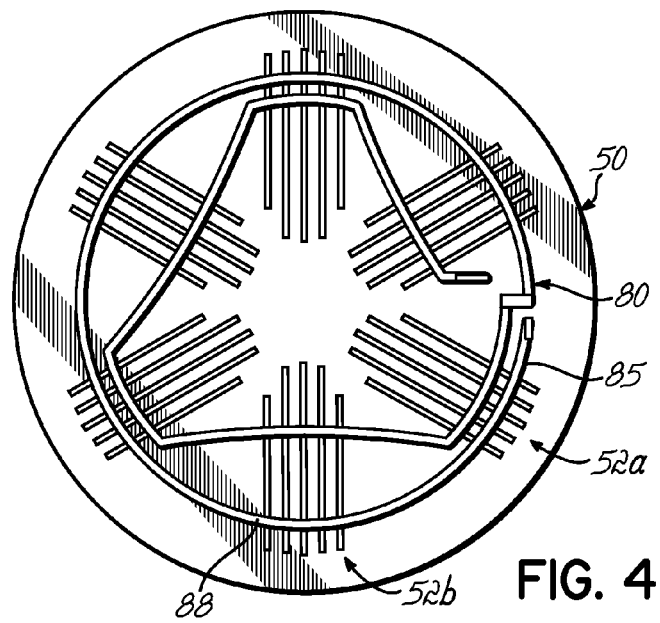
FIG. 4 is a plan view of one embodiment a peripheral ionization source that includes the antenna of FIG. 3.
Figure 5:
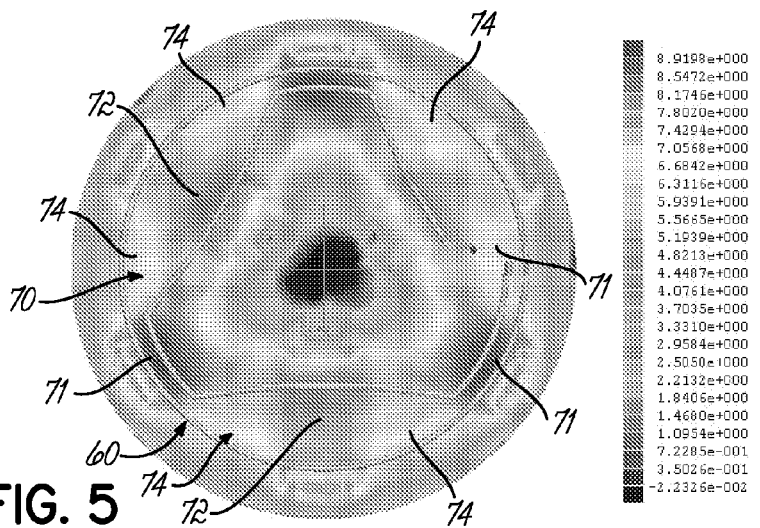
FIG. 5 is a plasma power density diagram corresponding to the source of FIG. 4.
Figure 7A:
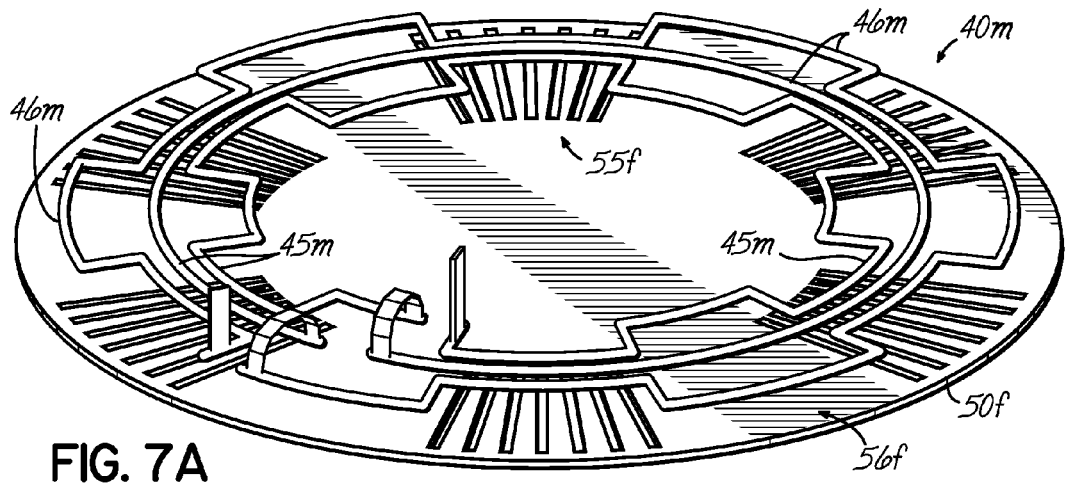
FIGS. 7A-7C are perspective diagrams of alternatives to the ICP source of FIG. 5.
Figure 7B:
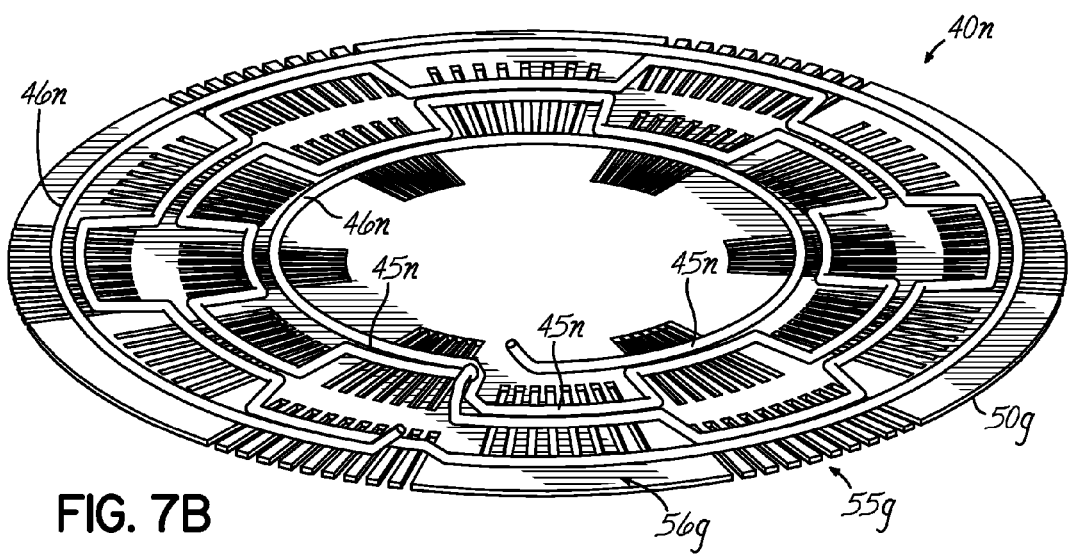

FIGS. 7A and 7B illustrate cost effective embodiments 40m and 40n of antennas suitable for an iPVD application as illustrated in FIG. 4. The antennas 40m and 40n each have high-efficiency sections 45m, 45n and low-efficiency sections 46m, 46n, each having constant cross-section tubular conductors with modulated pitch structure. Deposition baffles 50f and 50g are designed for use with antennas 45m and 45n, respectively, and have sections of high-transparency, 55f, 55g and opacity 56f, 56g, configured and aligned with the antenna sections according to the principles described above.

Figure 7C:
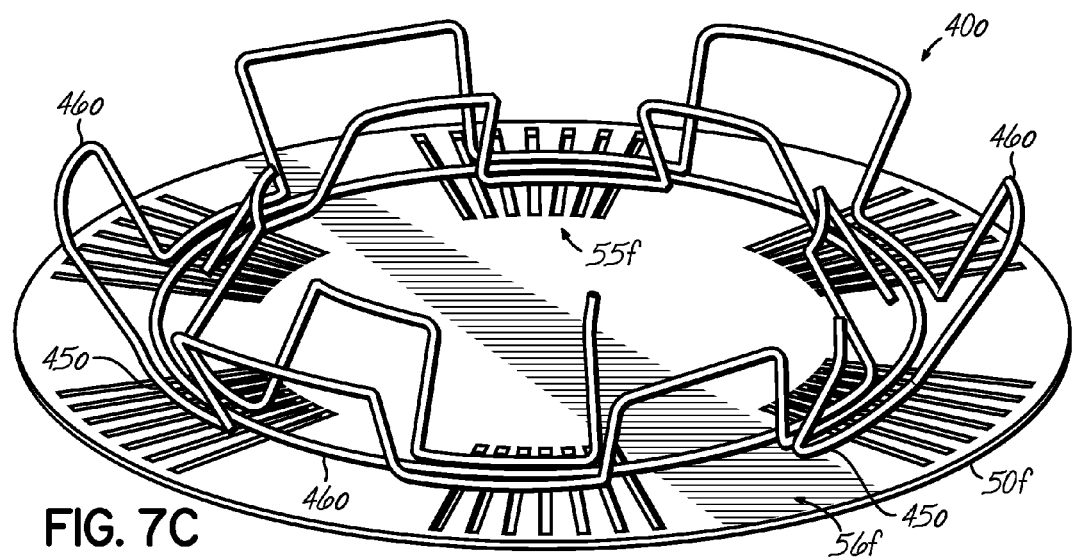

Antenna 40o of FIG. 7C is a preferred three-dimensional embodiment of an antenna that can be efficiently used with the baffle 50f (FIG. 7A). It includes six 30 degree sections 45o of closely-spaced conductors alternating with six 30 degree sections 46o of diverging conductors that extend away from the plane of the shield 50f. The concentrated high-efficiency sections 45o of the antenna 40o align with the high-transparency sections 55f of the shield 50f while the divergent low efficiency sections of the antenna 40o align with the opaque sections 56f of the shield 50f.

Advantages and benefits of the disclosed configurations include doubling of the lifetime of dielectric bell jar of FIG. 6 or window 25 of FIG. 2, by rotation of the dielectric, taking advantage of only a portion of the window being directly exposed to plasma and contamination. With these and other embodiments described above, ohmic losses into deposition shield 500 are less than with the prior art. Reliable plasma ignition is provided, particularly with the configuration of FIG. 6, by extending the winding 47a of the antenna 40i that extends beyond the shield 50d, where it can capacitively couple energy through the window to ignite the plasma. Partially opaque deposition shields can be used without losing power due to reduced inductive coupling. RF power deposition into the plasma is increased in pre-selected locations, which can be tailored by inductive element design by varying antenna pitch value of the antenna sections and the ratio between "low" and "high" transmission areas of the deposition shield. Intense RF magnetic fields are generated locally, increasing deposited power into the plasma even through slots in the deposition shield that are relatively short. Little RF power is lost in the opaque shield areas.

The invention has been described in the context of exemplary embodiments. Those skilled in the art will appreciate that additions, deletions and modifications to the features described herein may be made without departing from the principles of the present invention. Accordingly, the following is claimed:

The invention claimed is:

1. An ICP source comprising:
   an antenna formed of a single continuous conductor and lying in a plane, the antenna having a segmented configuration that includes a first plurality of high efficiency segments and an equal plurality of low efficiency segments, arranged in a ring of alternating high and low efficiency segments spaced at equal angular intervals around a central axis to couple power into a plasma within a processing chamber in an annular ring of alternating high and low power density distributed around the central axis;
   an RF generator connected across the single continuous conductor; and
   a planar shield centered on the central axis and generally parallel to the plane, the shield being spaced from the antenna on a side thereof facing the processing chamber, the shield being formed of a single conductive piece of metal having a second plurality of alternating high transparency slotted segments and low transparency solid segments spaced at equal angular intervals around the central axis, where the second plurality is twice the first plurality;
   half of the high transparency segments of the shield being adjacent and axially aligned with the high efficiency segments of the antenna, and the other half of the high transparency segments of the shield being adjacent and axially aligned with the low efficiency segments of the antenna;
   each of the low transparency segments of the shield being located between each adjacent pair of the high transparency segments of the shield, and each being axially aligned with each portion of the antenna between adjacent high and low efficiency sections of the antenna;
   whereby the source couples RF power to energize a ring-shaped plasma having a power distribution having first regions of the first plurality having a first power density spaced at equal angular intervals around the axis, second regions of the first plurality having a second power density that is lower than the first power density spaced at equal angular intervals around the axis between the first regions, and regions between each adjacent pair of the first and second regions having a third power density of the second plurality that is still lower than the second power density;
   the antenna having an inner winding and an outer winding, the inner and outer windings encircling the axis in the same direction and having a gap therebetween, the outer winding being generally circular, and the inner winding having a shape that is modulated to define relatively narrow sections of the gap where the inner winding is relatively close to the outer winding and relatively wide sections of the gap where the inner winding is more distant from the outer winding and is closer to the axis than at the relatively narrow sections of the gap, the relatively narrow sections being of the first plurality in number and spaced at equal angular intervals around the axis, and the relatively wide sections being of the first plurality in number and spaced at equal angular intervals around the axis and situated midway between adjacent ones of the narrow sections; and the high transparency segments of the shield being located such that one is adjacent each of the relatively narrow sections of the gap and one is adjacent each of the relatively wide sections of the gap.

2. An ICP source of claim 1 wherein the first plurality is three and the second plurality is six.

* * * * *